United States Patent
Mu et al.

(10) Patent No.: US 10,305,450 B2
(45) Date of Patent: May 28, 2019

(54) ATTENUATOR

(71) Applicant: Telefonaktiebolaget LM Ericsson (publ), Stockholm (SE)

(72) Inventors: Fenghao Mu, Hjarup (SE); Sven Mattisson, Bjarred (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 15/532,694

(22) PCT Filed: Dec. 3, 2014

(86) PCT No.: PCT/EP2014/076394
§ 371 (c)(1),
(2) Date: Jun. 2, 2017

(87) PCT Pub. No.: WO2016/086984
PCT Pub. Date: Jun. 9, 2016

(65) Prior Publication Data
US 2018/0337659 A1 Nov. 22, 2018

(51) Int. Cl.
*H03H 11/24* (2006.01)
*H03H 7/25* (2006.01)
(Continued)

(52) U.S. Cl.
CPC ......... *H03H 11/245* (2013.01); *H03G 1/0094* (2013.01); *H03H 7/25* (2013.01);
(Continued)

(58) Field of Classification Search
CPC .................................................. H01P 1/22
See application file for complete search history.

(56) References Cited

U.S. PATENT DOCUMENTS 3,646,484 A * 2/1972 Maxwell .............. H03G 1/0088
327/403
5,493,246 A * 2/1996 Anderson ............ G11C 27/026
327/307
(Continued)

FOREIGN PATENT DOCUMENTS

EP    1351382 A2    10/2003

OTHER PUBLICATIONS

PCT International Search Report, dated Aug. 10, 2015, in connection with International Application No. PCT/EP2014/076394, all pages.
(Continued)

*Primary Examiner* — HsinChun Liao
(74) *Attorney, Agent, or Firm* — Leffler Intellectual Property Law, PLLC

(57) ABSTRACT

An attenuator for attenuating a signal is disclosed. The attenuator comprises a differential input port with a positive input node and a negative input node to receive the signal; and a differential output port with a positive output node and a negative output node to output the attenuated signal. The attenuator further comprises a first switched resistor network connected between the positive input node and the positive output node; and a second switched resistor network connected between the negative input node and the negative output node. Further a pair of compensation paths is connected to the first and second switched resistor networks for cancellation their parasitic leakages, where a first compensation path is connected between the positive input node and the negative output node, and a second compensation path is connected between the negative input node and the positive output node. The attenuator further comprises a control circuit to generate control signals for controlling the first and second switched resistor networks.

15 Claims, 11 Drawing Sheets

(51) Int. Cl.
  *H03G 1/00* (2006.01)
  *H04B 1/40* (2015.01)
  *H04B 7/06* (2006.01)
(52) U.S. Cl.
  CPC ............ *H04B 1/40* (2013.01); *H04B 7/0608* (2013.01); *H03G 1/0088* (2013.01); *H03G 2201/106* (2013.01)

(56) References Cited

U.S. PATENT DOCUMENTS

| | | |
|---|---|---|
| 7,869,312 B1 | 1/2011 | Li et al. |
| 2010/0007419 A1 | 1/2010 | Gilbert |
| 2013/0043962 A1 | 2/2013 | Granger-Jones |

OTHER PUBLICATIONS

PCT Written Opinion, dated Aug. 10, 2015, in connection with International Application No. PCT/EP2014/076394, all pages.
Wei Cheng et al., A Wideband IM3 Cancellation Technique for CMOS II- and T-Attenuators, IEEE Journal of Solid-State Circuits, vol. 48, No. 2, Feb. 2013, pp. 358-368.
Wei Cheng et al., A Wideband IM3 Cancellation Technique for CMOS Attenuators, ISSCC 2012, Session 4, RF Techniques, 4.3, 3 pages.
Byung-Wook Min et al., A 10-50-GHz CMOS Distributed Step Attenuator With Low Loss and Low Phase Imbalance, IEEE Journal of Solid-State Circuits, vol. 42, No. 11, Nov. 2007, pp. 2547-2554.
Qiang Li et al., CMOS T/R Switch Design: Towards Ultra-Wideband and Higher Frequency, IEEE Journal of Solid-State Circuits, vol. 42, No. 3, Mar. 2007, pp. 563-570.
Jesper Steensgaard, Bootstrapped Low-Voltage Analog Switches, JSCC, 1999, 4 pages.
Jianhong Xiao et al., A High Dynamic Range CMOS Variable Gain Amplifier for Mobile DTV Tuner, IEEE Journal of Solid-State Circuits, vol. 42, No. 2, Feb. 2007, pp. 292-301.
Sunbo Shim et al., A Highly-Linear CMOS RF Programmable-Gain Driver Amplifier with a Digital-Step Differential Attenuator for RF Transmitters, Radio Frequency Integrated Circuits Symposium (RFIC), 2013 IEEE, Jun. 2, 2013, pp. 455-458.
Walter Ciccognani et al., Compensating Digital Attenuator Differential Phase Shift, Microwave Techniques, Apr. 23, 2008, pp. 1-4.
Moon-Kyu Cho et al., A Broadband Digital Step Attenuator with Low Phase Error and Low Insertion Loss in 0.18-μm SOI CMOS Technology, ETRI Journal, vol. 35, No. 4, Aug. 2013, pp. 638-643.
Jens Wagner et al., X-type Attenuator in CMOS with novel control linearization, very low phase variations and automatic matching, Proceedings of the 8th European Microwave Integrated Circuits Conference, Oct. 6-8, 2013, Nurembger, Germany, pp. 200-203.

\* cited by examiner

ATTENUATOR

TECHNICAL FIELD

Embodiments herein relate to an attenuator for attenuating a signal. In particular, they relate to a radio frequency wideband step attenuator for attenuating a radio frequency signal in an electronic device.

BACKGROUND

Attenuators are circuits used to control amplitude of a signal either continuously or in steps. When the signal is controlled in steps by an attenuator, the attenuator is referred as a step attenuator. The attenuators or step attenuators are widely employed in various electronic devices, e.g. radio frequency transceivers or radio frequency frontends in wireless communication devices including, for example user equipment or mobile devices and base stations, multi-antenna systems in radio base stations for both communication and localization, as well as in other general electronic circuits and equipment, such as automatic gain control circuits and measurement equipment etc. For radio frequency frontends, an on-chip step attenuator designed in Complementary Metal-Oxide-Semiconductor (CMOS) technology has advantages of small size, low cost, flexible and high integration level etc. There are some requirements for designing on-chip step attenuators, such as good linearity, low insertion loss, wide bandwidth and accuracy in attenuation steps etc.

In Cheng, W. et al, A Wideband IM3 Cancellation Technique for CMOS Attenuators, *IEEE International Solid-State Circuits Conference,* 2012, and in Cheng, W. et al, A Wideband IM3 Cancellation Technique for CMOS π- and T-Attenuators, *IEEE Journal of Solid-State Circuits,* 2013, Vol. 48, NO. 2, on-chip Pi-type and T-type step attenuators are disclosed which provide attenuation steps of 6, 12, 18 and 24 dB. However, the disclosed Pi-type and T-type step attenuators have large insertion loss when working at lower attenuation mode, i.e. when attenuation level is lower, such as attenuation steps of 6 or 12 dB, especially when no attenuation is needed. High insertion loss will reduce gain and required signal to noise ratio (SNR) for input signals. Further, the disclosed Pi-type and T-type step attenuators also suffer from switch leakages which damage attenuation levels for the input signals at high frequencies during deep attenuation mode.

In Xiao, J. et al, A High Dynamic Range CMOS Variable Gain Amplifier for Mobile DTV Tuner, *IEEE Journal of Solid-State Circuits,* 2007, Vol. 42, No. 2, a variable gain amplifier suitable for mobile digital television (DTV) tuners is presented. Variable gain is achieved by using a capacitive attenuator and current-steering transconductance stages. Although the presented variable gain amplifier provides gain and attenuation, its linearity is poor due to active devices, i.e. the transconductance stages. A poor linearity will result in poor frequency selectivity for a radio frequency front-end, and thus degrade required SNR due to interferences from other unwanted frequency signals.

SUMMARY

Therefor it is an object of embodiments herein to provide an attenuator with improved performance.

According to one aspect of embodiments herein, the object is achieved by an attenuator for attenuating a signal. The attenuator comprises a differential input port with a positive input node and a negative input node to receive the signal, and a differential output port with a positive output node and a negative output node to output the attenuated signal. The attenuator further comprises a first switched resistor network connected between the positive input node and the positive output node; and a second switched resistor network connected between the negative input node and the negative output node. The attenuator further comprises a pair of compensation paths for cancellation of parasitic leakages in the first and second switched resistor networks. The pair of compensation paths is connected such that a first compensation path is connected between the positive input node and the negative output node, and a second compensation path is connected between the negative input node and the positive output node. The attenuator further comprises a control circuit to generate control signals for controlling the first and second switched resistor networks.

Since the attenuator according to embodiments herein uses the pair of compensation paths, parasitic leakages in the first and second switched resistor networks are cancelled. The cancellation is achieved by cross-coupling the pair of compensation paths, i.e. the first compensation path is connected between the positive input node and the negative output node, and the second compensation path is connected between the negative input node and the positive output node. In this way, any leakage signals at the positive input node are coupled to the negative output node, so as to cancel any leakage signals at the negative output node. In the same way, any leakage signals at the negative input node are coupled to the positive output node, so as to cancel any leakage signals at the positive output node. This results in a good attenuation performance, especially at high frequencies and in deep attenuation steps. Further the switched resistor networks are passive and therefor have a high linearity.

Thus, embodiments herein provide attenuators with improved performance on e.g. linearity and attenuation levels at high frequencies and in deep attenuation steps, etc.

BRIEF DESCRIPTION OF THE DRAWINGS

Examples of embodiments herein are described in more detail with reference to attached drawings in which.

DETAILED DESCRIPTION

Figure 1:
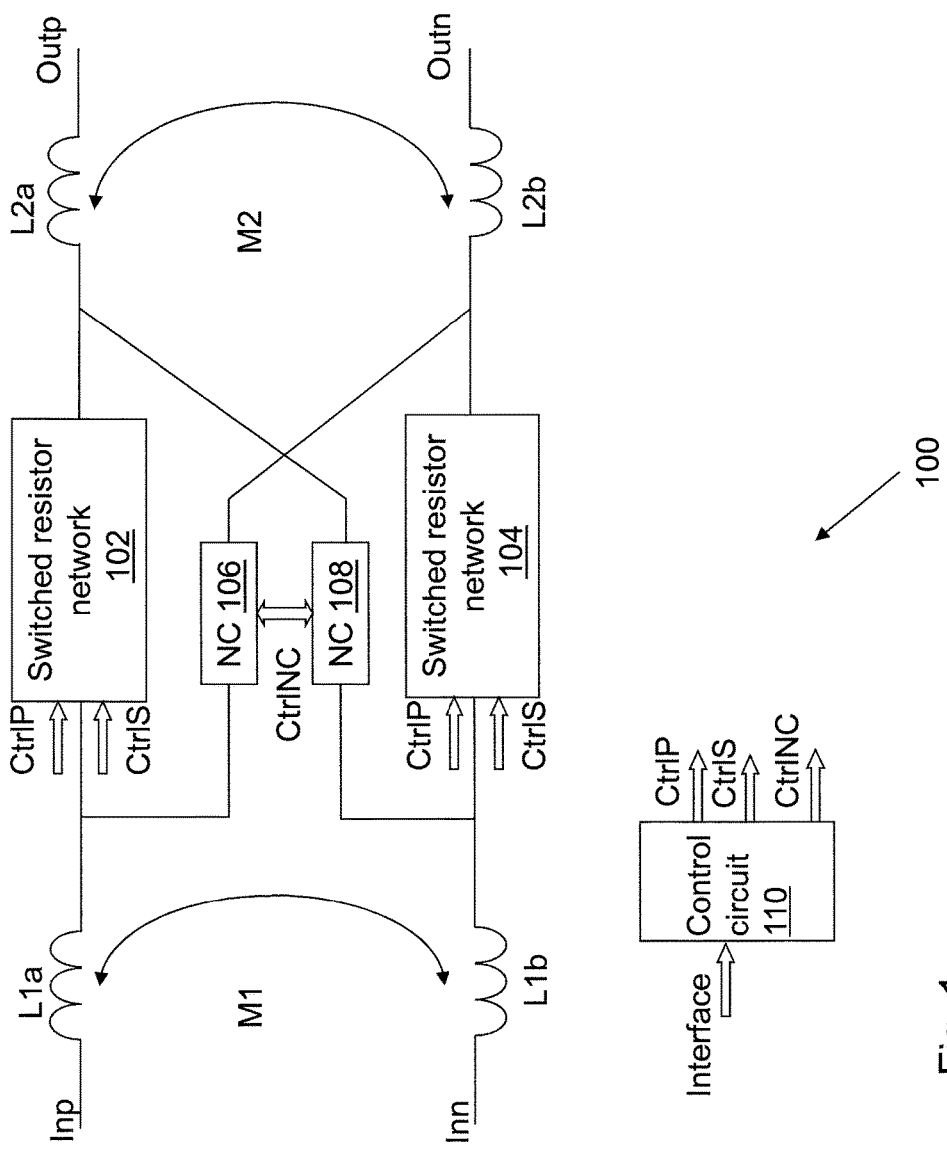
FIG. 1 is a general block view of an attenuator according to embodiments herein.

A general view of an attenuator 100 for attenuating a signal according to embodiments herein is shown in FIG. 1. The attenuator 100 comprises a differential input port Inp/Inn with a positive input node Inp and a negative input node Inn to receive the signal, and a differential output port Outp/Outn with a positive output node Outp and a negative output node Outn to output the attenuated signal.

The attenuator 100 further comprises a first switched resistor network 102 connected between the positive input node Inp and the positive output node Outp, and a second switched resistor network 104 connected between the negative input node Inn and the negative output node Outn. The first and second switched resistor networks 102/104 are configured to create desired attenuation.

The attenuator 100 further comprises a pair of compensation paths for cancellation of parasitic leakages in the first and second switched resistor networks 102/104. As shown in FIG. 1, a first compensation path 106 referred to as Neutralization Compensation NC 106 in FIG. 1, is connected between the positive input node Inp and the negative output node Outn, and a second compensation path 108 referred to as NC 108 in FIG. 1, is connected between the negative input node Inn and the positive output node Outp.

Further, a control circuit 110 is also comprised in the attenuator 100 to generate control signals for controlling the first and second switched resistor networks 102/104.

According to some embodiments, the control circuit 110 in the attenuator 100 may be further configured to generate control signals for controlling the pair of compensation paths 106/108.

The control signals CtrlS, CtrlP and CtrlNC are generated by the control circuit 110 through digital data interface. The first and second switched resistor networks 102/202 are controlled by the control signals CtrlP and CtrlS so that the resistance values of the first and second switched resistor networks 102/202 are tunable. The control signal CtrlNC is to control the compensation path 106/108.

According to some embodiments, the attenuator 100 may further comprise a first pair of inductors L1a/L1b connected at the differential input port Inp/Inn and a second pair of inductors L2a/L2b connected at the differential output port Outp/Outn. In these embodiments, the first and second switched resistor networks 102/104 are coupled to the differential input/output port via the first and second pair of inductors, respectively. The first and second pair of inductors L1a/L1b, L2a/L2b are used to compensate the bandwidth of the attenuator 100. According to some embodiments, the first and second pair of inductors are mutually coupled inductors, with coupling coefficients M1 and M2 respectively.

Figure 2:
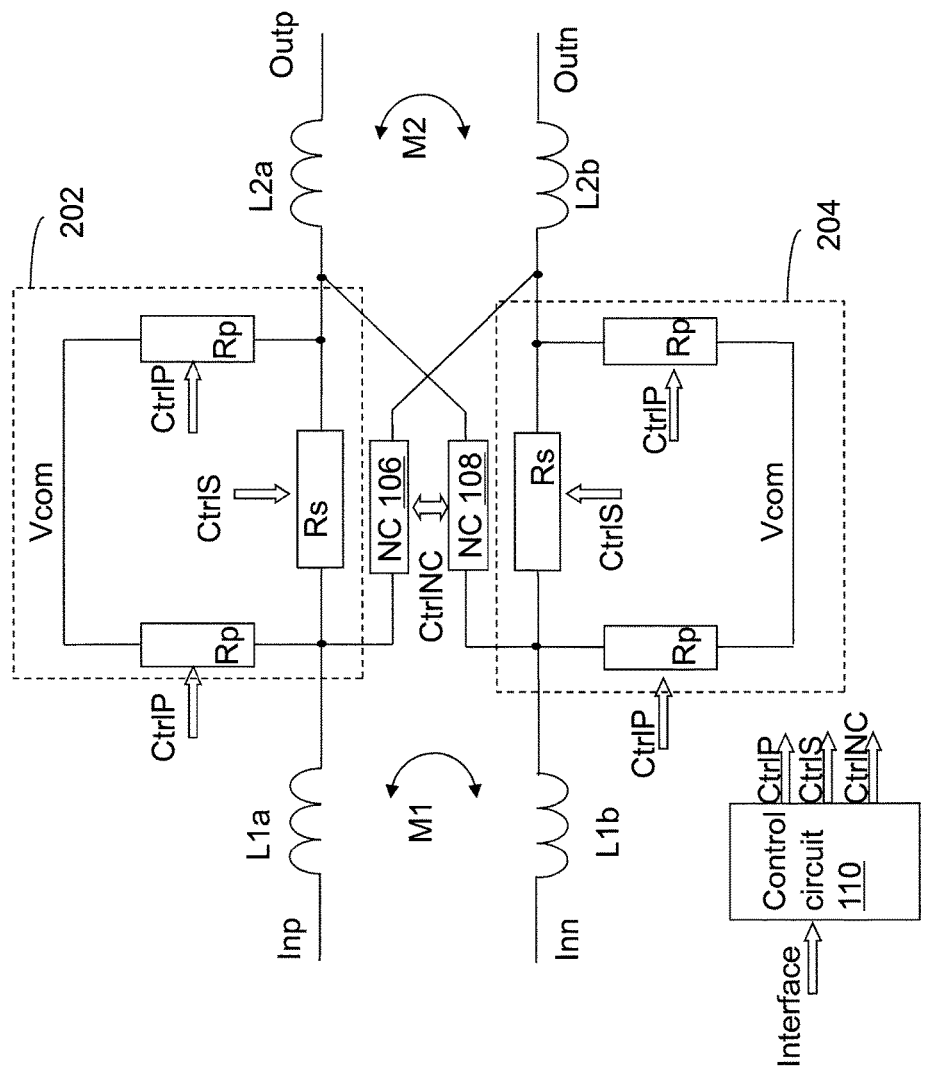
FIG. 2 is a schematic block view illustrating an attenuator with Pi-type switched resistor networks according to embodiments herein.

According to one embodiment, the attenuator 100 may be implemented by circuits shown in FIG. 2, where the first and second switched resistor networks 102/104 may be implemented by Pi-type switched resistor networks 202/204.

As shown in FIG. 2, the Pi-type switched resistor networks 202/204 each comprises two switchably variable parallel resistors Rp and one switchably variable series resistor Rs.

Figure 3:
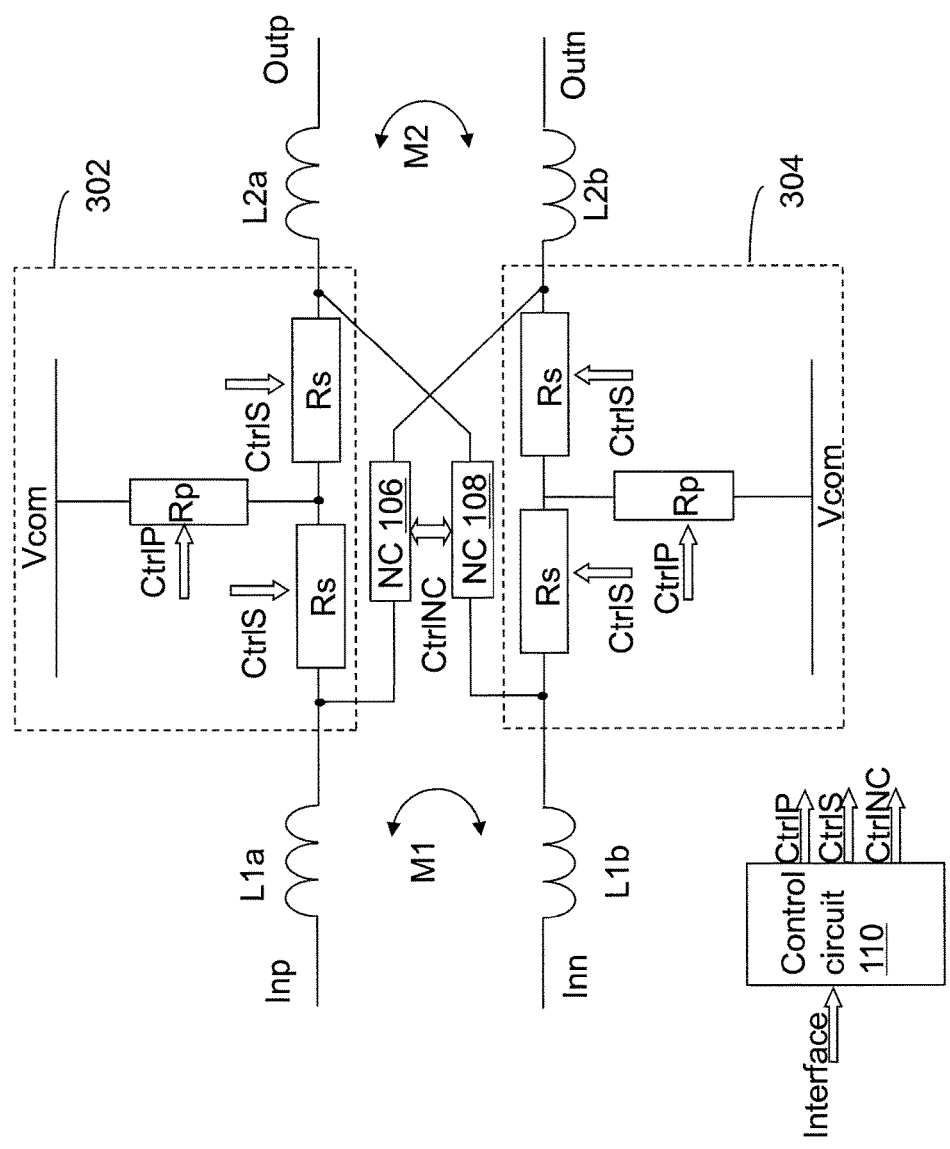
FIG. 3 is a schematic block view illustrating an attenuator with T-type switched resistor networks according to embodiments herein.

According to one embodiment, the attenuator 100 may be implemented by circuits shown in FIG. 3, where the first and second switched resistor networks 102/104 may be implemented by T-type switched resistor networks 302/304.

As shown in FIG. 3, the T-type switched resistor networks 302/304 each comprises one switchably variable parallel resistor Rp and two switchably variable series resistors Rs.

Figure 4:
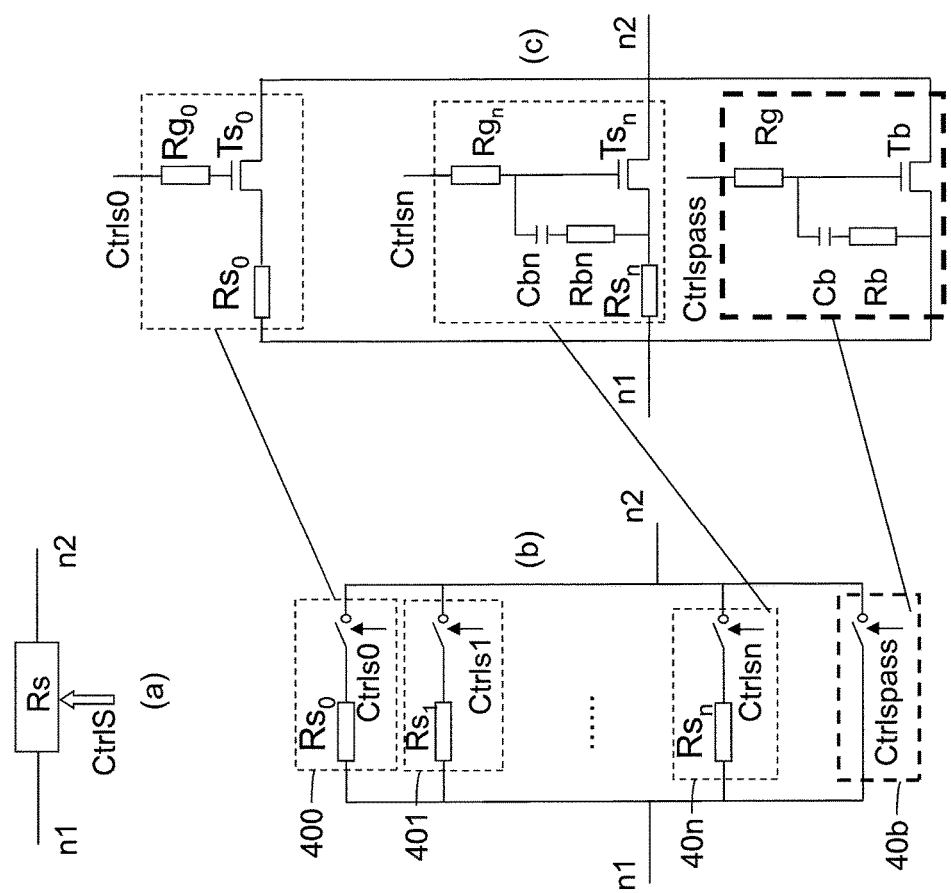
FIG. 4 is a schematic diagram illustrating a switchably variable series resistor according to embodiments herein.

According to some embodiments, the switchably variable series resistor Rs may be implemented by circuits shown in FIG. 4, where FIG. 4(a) shows a symbol of the switchably variable series resistor Rs, FIG. 4(b) shows an example structure of the switchably variable series resistor Rs and FIG. 4(c) shows each branch of the switchably variable series resistor Rs in more detail.

As shown in FIG. 4(b), the switchably variable series resistor Rs comprises one or more switched resistor branches 400, 401, ... 40n, each of the one or more switched resistor branches 400, 401, ... 40n comprises a resistor $Rs_0$, $Rs_1$, ... $Rs_n$ in series with a switch. The switchably variable series resistor Rs further comprises a by-pass path 40b.

As shown in FIG. 4(c), for one or more switches, a bootstrap path comprising a capacitor in series with a resistor is connected between a gate and a drain or source of the switch depending on size of the one or more switches. Using bootstrap path can effectively improve the linearity of the switch. However, for smaller size of the switches, the bootstrap path may not be needed, for example, in branch 400, there is no bootstrap path connected between a gate and a drain or source of the switch $Ts_0$.

As shown in FIG. 4(c), the by-pass path 40b comprises a switch Tb, and a bootstrap path comprising a capacitor Cb in series with a resistor Rb is connected between a gate and a drain or source of the switch Tb.

When the switchably variable series resistor Rs comprises multiple switched resistor branches 400, 401, ... 40n, the control signal CtrlS generated by the control circuit 110 comprises multiple control signals Ctrls0, Ctrls1, ..., Ctrlsn to control the switch in each branch, where n is positive integer. The control signal CtrlS further comprises Ctrlspass to control the by-pass path 40b.

Figure 5:
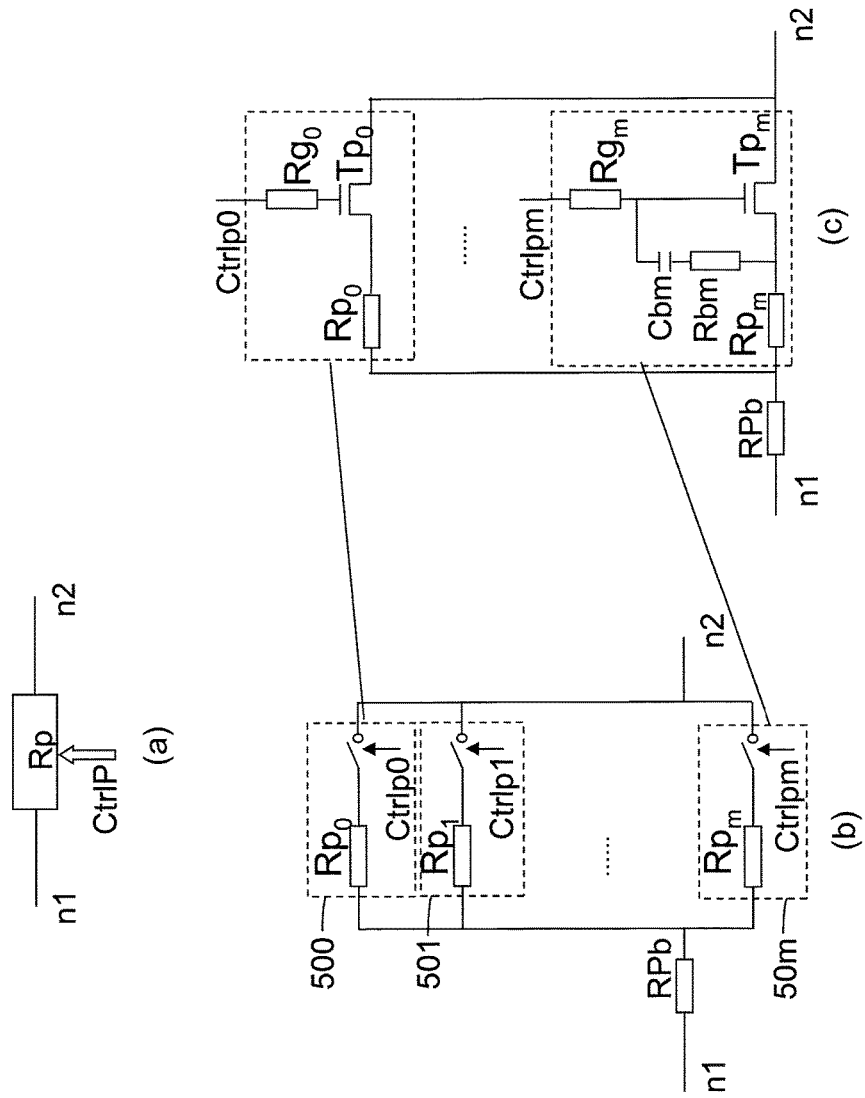
FIG. 5 is a schematic diagram illustrating a switchably variable parallel resistor according to embodiments herein.

According to some embodiments, the switchably variable parallel resistor Rp may be implemented by circuits shown in FIG. 5, where FIG. 5(a) shows a symbol of the switchably variable parallel resistor Rp, FIG. 5(b) shows an example structure of the switchably variable parallel resistor Rp and FIG. 5(c) shows each branch of the switchably variable parallel resistor Rp in more detail.

As shown in FIG. 5(b), the switchably variable parallel resistor Rp comprises one or more switched resistor branches 500, 501, ... 50m, and the switchably variable parallel resistor Rp further comprises a resistor (RPb) connected in series with the switched resistor branches 500, 501, ... 50m. Each of the one or more switched resistor branches 500, 501, ... 50m comprises a resistor $Rp_0$, $Rp_1$, ... $Rp_m$ in series with a switch.

As shown in FIG. 5(c), for one or more switches, a bootstrap path comprising a capacitor in series with a resistor is connected between a gate and a drain or source of the switch depending on size of the one or more switches. For example, for smaller size switch $Tp_0$ in branch 500, there is no bootstrap path connected between a gate and a drain or source of the switch $Tp_0$.

When the switchably variable parallel resistor Rp comprises multiple switched resistor branches 500, 501, ... 50m, the control signal CtrlP generated by the control circuit 110 comprises multiple control signals Ctrlp0, Ctrlp1, ..., Ctrlpm to control the switch in each branch, where m is positive integer.

Figure 6:
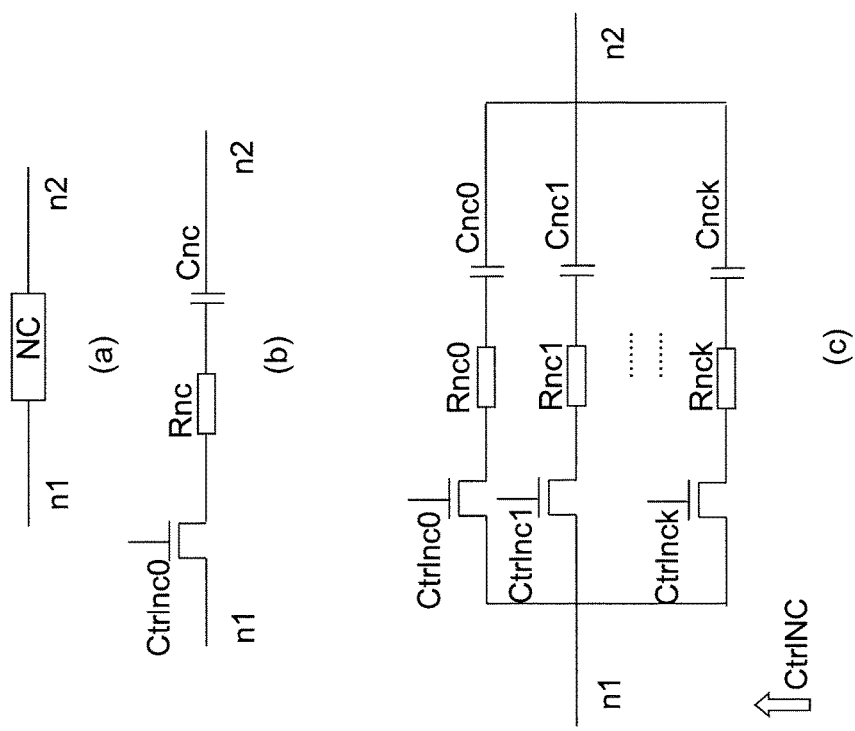
FIG. 6 is a schematic diagram illustrating a compensation path according to embodiments herein.

According to some embodiments, the compensation path 106/108 may be implemented by circuits shown in FIG. 6, where FIG. 6(a) shows a symbol of the compensation path 106/108, FIG. 6(b) shows an example structure of the compensation path 106/108, and FIG. 6(c) shows another example structure of the compensation path 106/108. As shown in FIGS. 6(b) and (c), each compensation path 106/108 comprises one or more switched capacitor branches, and each switched capacitor branch comprises a capacitor, Cnc, $Cnc_0$, $Cnc_1$, ... $Cnc_k$ connected in series with a resistor, Rnc, $Rnc_0$, $Rnc_1$, ... $Rnc_k$. In by-pass mode, the compensation paths for cancelling the parasitic leakages can be switched off as to reduce the insertion loss.

According to some embodiments, each switched capacitor branch in the compensation path 106/108 further comprises a switch connected in series with the capacitor Cnc, $Cnc_0$, $Cnc_1$, ... $Cnc_k$ and the resistor Rnc, $Rnc_0$, $Rnc_1$, ... $Rnc_k$.

When the compensation path 106/108 comprises multiple switched capacitor branches, the control signal CtrlNC comprises multiple control signals Ctrlnck, ..., Ctrlnc1, Ctrlnc0 to control the switch in each branch, where k is an integer larger or equal to 0.

Figure 7:
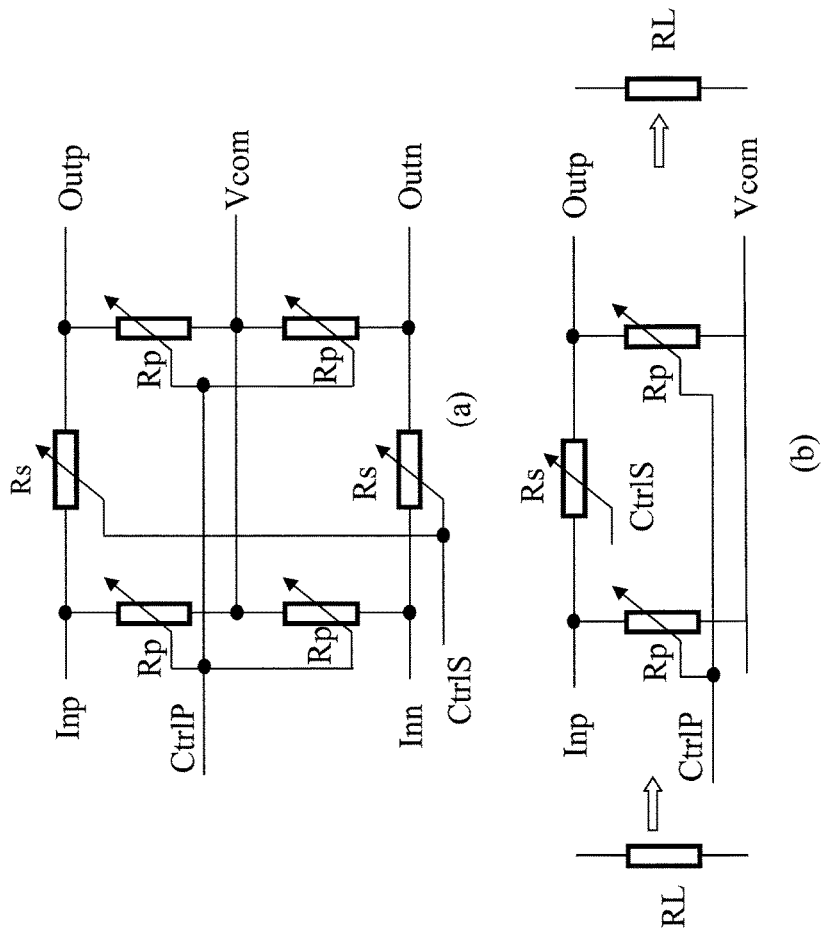
FIG. 7 is a simplified schematic diagram illustrating an equivalent circuit for the Pi-type switched resistor network in FIG. 2.

Implementation details, performance and advantages of the attenuator 100 according to embodiments herein are described below. As described above, the switched resistor network 102/104 are used to set the desired attenuation. In order to show the relation between the desired attenuation and the resistor value, example design equations are derived for the Pi-type switched resistor network 202/204. A simplified equivalent circuit of the Pi-type switched resistor network 202/204 without the compensation path is shown in FIG. 7, where FIG. 7(a) shows the Pi-type switched resistor network 202/204 connected in differential, and FIG. 7(b) shows its single-ended part.

For simplicity, the Pi-type switched resistor network 202/204 connected in single-ended in FIG. 7(b) is analysed, where the input and output port impedances $R_L$=50 are added to it. In an ideal condition for matching requirement, the switched resistor network 202/204 should match the input and output port impedance $R_L$=50 ohm, that is $$R_L = Rp \| (R_L \| Rp + Rs) \quad \text{Eq. (1)}$$

While in matched condition, the voltage gain vg is given by $$vg = \frac{Rp \| R_L}{Rs + Rp \| R_L} = \frac{Rp \cdot R_L}{Rs \cdot Rp + Rs \cdot R_L + Rp \cdot R_L} \quad \text{Eq. (2)}$$

From matching requirement, it is given $$Rs \cdot Rp^2 - 2 \cdot R_L^2 \cdot Rp - R_L^2 \cdot Rs = 0 \quad \text{Eq. (3)}$$

So Rs may be expressed as $$Rs = \frac{2R_L^2 \cdot Rp}{Rp^2 - R_L^2} \quad \text{Eq. (4)}$$

Replace Rs in the attenuation or gain expression (2) with Rs expression in (4), which gives $$vg = \frac{Rp - R_L}{Rp + R_L} = \frac{1 - \alpha}{1 + \alpha} \quad \text{Eq. (5)}$$

Where $$\alpha = \frac{R_L}{Rp} < 1,$$

for an ideal pure resistor case.

Rp may be written as a function of desired attenuation $$Rp = \frac{R_L \cdot (1 + vg)}{1 - vg} \quad \text{Eq. (6)}$$

Where $$vg = 10^{-\frac{VG}{20}},$$

and VG is the required or desired attenuation in unit of dB.

It should be noted that above equations are example design equations for Pi-type switched resistor network, the skilled person will appreciate that for T-type switched resistor network, design equations will be different.

Turning back to FIG. 4, where the structure of the switchably variable series resistor Rs according to one embodiment herein is shown. As described above, the switchably variable series resistor Rs comprises a by-pass path 40b, as shown in dashed-line box at the bottom of FIGS. 4(b) and (c). When there is no need to attenuate the input signal, the attenuator 100 is set to a by-pass mode and all switched resistor branches 400, 401, ..., 40n are by passed by turning on the switch Tb in the by-pass path 40b. The control signal CtrlSpass is set to logic high during the by-pass mode. As shown in FIG. 4(c), in the by-pass path 40b, a bootstrap path comprising a capacitor Cb in series with a resistor Rb is connected between the gate and drain or source of the switch Tb. The purpose of the capacitor Cb is to bootstrap the gate voltage of the switch Tb by using the input signal at its drain or source, and to keep the voltage between the gate and drain or source close to a constant DC voltage provided by the control signal CtrlSpass. It means that the conducting resistor Ron of the MOS switch transistor Tb is close to constant, thus improving the linearity of the switch Tb. Resistor Rb inserted in the bootstrap path is to avoid increasing capacitive load in the signal path and also reduce the leakage caused by the parasitic capacitance of the switch transistor Tb. Resistor Rg is a resistor in series between the control node and the gate of the switch transistor Tb, and the time constant of RgCb should be much larger than the period of the lowest operating frequency. In this way, lower insertion loss for the input signals at higher frequencies is achieved. In other attenuation modes, the control signal CtrlSpass is set to logic low, the switch Tb is turned off, and the by-pass path is disconnected.

The switched resistor branches 400, 401, ..., 40n are used for different attenuation settings including the by-pass mode. In the by-pass mode, all control signals Ctrls0, Ctrls1, ..., Ctrlsn are set to logic high, so all switches in the switched resistor branches 400, 401, ..., 40n are conducting, this reduces the insertion loss further.

While in other attenuation settings, only some of the switched resistor branches 400, 401, ..., 40n conduct, and provide a resistance value Rs according to the expression given by Eq. (4). Due to silicon process variations, resistance value for an on-chip resistor may vary in a range of ±25%. Therefor in practice, more control bits may be added for trimming the resistance.

The resistors in the switched resistor branches 400, 401, ..., 40n may be designed, e.g. in a binary weighted size, i.e. $Rs_0$=R, $Rs_1$=R/2, $Rs_n$=R/$2^n$. For the switched resistor branch 40n, it may be viewed as $2^n$ branches of unit resistor cell R in parallel. So $Rs_n$ is the smallest one in resistance, and switch $Ts_n$ is the largest one in size. Enlarging the size of $Ts_n$ may reduce the impact of the conducting resistance Ron of the switch $Ts_n$, so as to improve the linearity, but at a cost of introducing larger parasitic capacitances in the signal path. Therefore, bootstrap path used here to improve the linearity is more effective for the larger size switches, as shown in FIG. 4(c). However, for smaller size switches, the bootstrap path may not be needed. As seen from FIG. 4(c), for the switched resistor branch 400, there is no bootstrap path for switch $Ts_0$.

For the switchably variable parallel resistor Rp, as shown in FIG. 5, binary weighted resistors may also be used in the switched resistor branches 500, 501, ... 50m. In the by-pass mode, all switched resistor branches are disconnected, so the insertion loss is minimized.

In other attenuation modes, the value of Rp may be chosen according Eq. (6). Bootstrap paths are also optionally used depending on size of the switch, e.g. a bootstrap path is used for largest switch $Tp_m$ in the switched resistor branch 50m, and ignored for the smallest switch $Tp_0$ in the switched resistor branch 500, as shown in FIG. 5(c).

Figure 8:
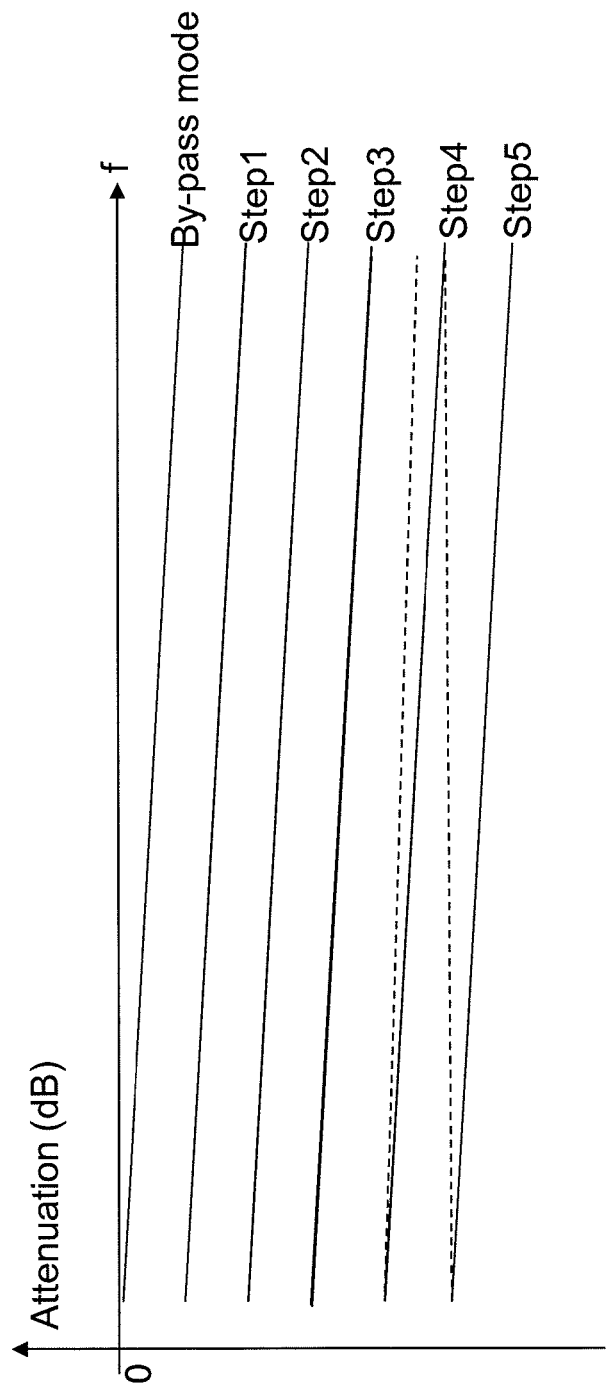
FIG. 8 is a diagram showing frequency response for an attenuator according to one embodiment herein.

In practice, due to parasitic capacitances between the three nodes, i.e. gate, drain and source of the switch Tb, parasitic leakages exist, and these leakages damage attenuation settings in deep attenuation steps. FIG. 8 shows attenuation level versus frequency for the by-pass mode and different attenuation steps, where the desired attenuation levels are plotted in solid lines, while the real attenuation levels due to the parasitic capacitances are plotted in dotted lines. It may be seen that the parasitic leakages due to the parasitic capacitances ruin the desired attenuation levels, especially at higher frequencies.

As shown in FIGS. 1-3, the attenuator 100 is in a differential structure, this makes it possible to add a pair of compensation path NC 106/108 to neutralize or cancel the leakages. The cancellation is achieved by cross-coupling the pair of compensation paths 106/108, i.e. the first compensation path 106 is connected between the positive input node Inp and the negative output node Outn, and the second compensation path 108 is connected between the negative input node Inn and the positive output node Outp. In this way, any leakage signals at the positive input node are coupled to the negative output node, thereby cancel any leakage signals at the negative output node. In the same way, any leakage signals at the negative input node are coupled to the positive output node, thereby cancel any leakage signals at the positive output node. This results in a good attenuation performance, especially at high frequencies and in deep attenuation steps, as shown in the solid lines in FIG. 8, where the slopes of attenuation levels for all steps are the same after the compensation.

As described above, the compensation path 106/108 comprises one or more switched capacitor branches. When only one switched capacitor branch is used, as shown in FIG. 6(b), to reduce the insertion loss, the switch transistor is turned off in the by-pass mode, so the compensation path is disconnected from the switched resistor networks. However, it should be noted that switch transistors in the compensation paths are optional, i.e. the compensation paths may only comprise capacitors and resistors, and may always connected to the switched resistor networks in the by-pass mode and at other attenuation settings.

In FIG. 6(c), several switched capacitor branches are used, so it will give more freedom to tune compensation for different attenuation settings or levels. As it is a programmable approach, it may also deal with process variations and design errors due to inaccurate extraction of the values for the capacitors and resistors in design tools.

Figure 9:
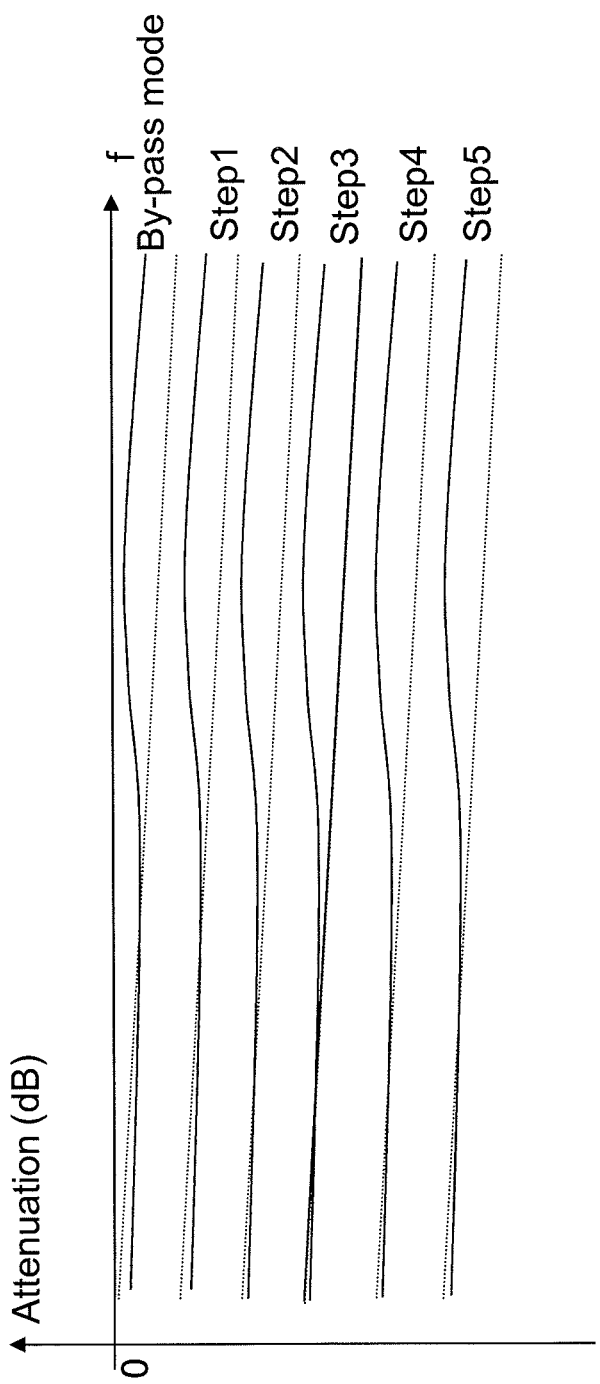
FIG. 9 is a diagram showing frequency response for an attenuator according to another embodiment herein.

From FIG. 8, it may be seen that the attenuation levels have slopes along the frequency axis. This means that insertion loss at higher frequencies is higher than that of at lower frequencies, this leads to a narrower bandwidth for the attenuator. To improve the bandwidth, a pair of inductors with mutual coupling may be employed at both the input port and output port. As shown in FIGS. 1-3, the first pair of inductors L1a/L1b is connected at the differential input port Inp/Inn to resonate with the input parasitic capacitance at desired frequencies, and the second pair of inductors L2a/L2b is connected at the differential output port Outp/Outn to resonate with the output parasitic capacitance at desired frequencies. In this way, the slops of the attenuation levels are reduced, and the bandwidth of the attenuator 100 is extended. This is illustrated in FIG. 9, where the solid curves are frequency responses, i.e. attenuation levels versus frequency, with inductor compensation, and the dotted lines are uncompensated frequency responses.

Figure 10:
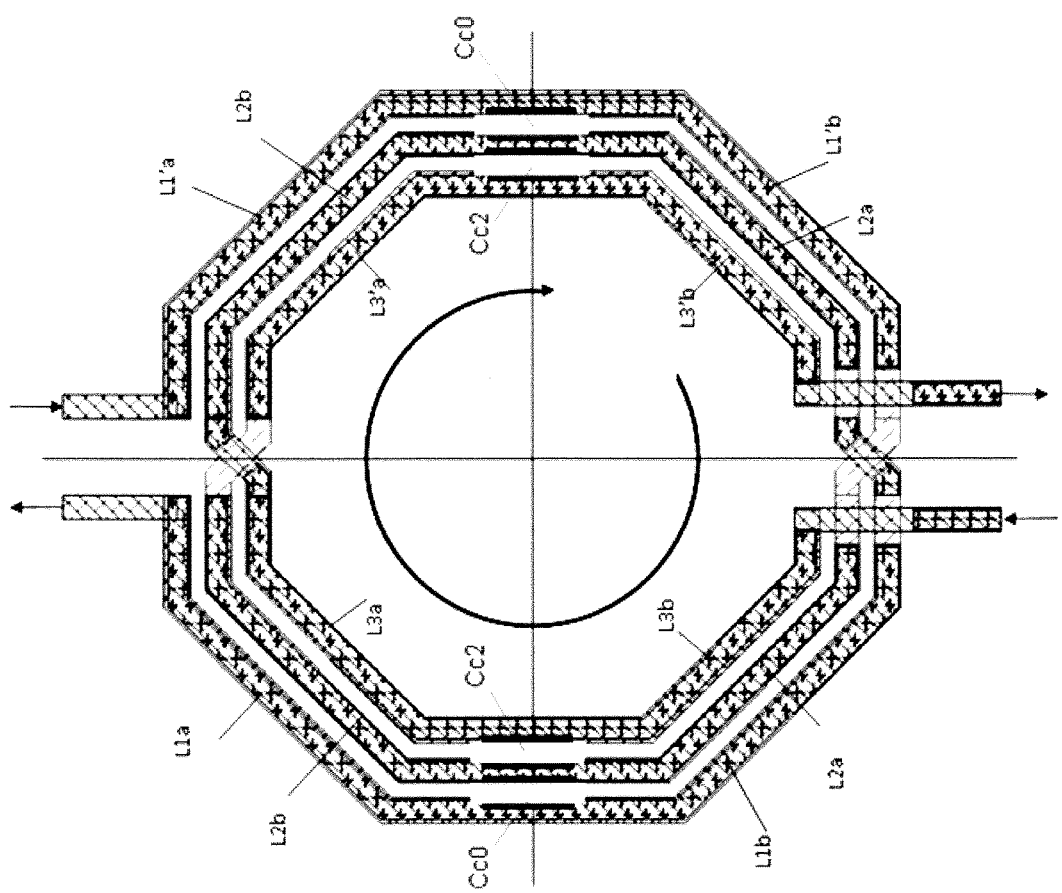
FIG. 10 is a drawing showing an example layout of compensation inductors according to embodiments herein.

An example layout of the two pairs of mutual coupling inductors is shown in FIG. 10, where the layout of L1a/L1b and L2a/L2b is designed in an interleaved way, as to save silicon area and increase the Q factor by utilising mutual inductance between the two parts. Of course other types of separated inductors may also be used, but at a cost of large silicon area and a bit more insertion loss.

To summarise the discussions above, advantages of various embodiments of the attenuator 100 include:
Accurate attenuation levels or steps: The switched resistor networks in Pi or T structure make resistances tunable and may also cope with process variations, so accurate attenuation levels and steps are provided.
Larger range of attenuation: Compensation paths are used to cancel the parasitic leakages so that attenuation levels or steps at deep attenuation are more accurate, therefore the attenuator 100 achieves a larger range of attenuation.
Higher linearity and low insertion loss: Bootstrap paths are used in some embodiments for larger size switch transistors and for the by-pass path so that linearity is improved and insertion loss is reduced.
Wide bandwidth: Compensation inductors are used in some embodiments at both input port and output port to resonate with the input and output parasitic capacitances respectively, so the bandwidth of the attenuator 100 is extended.

Figure 11:
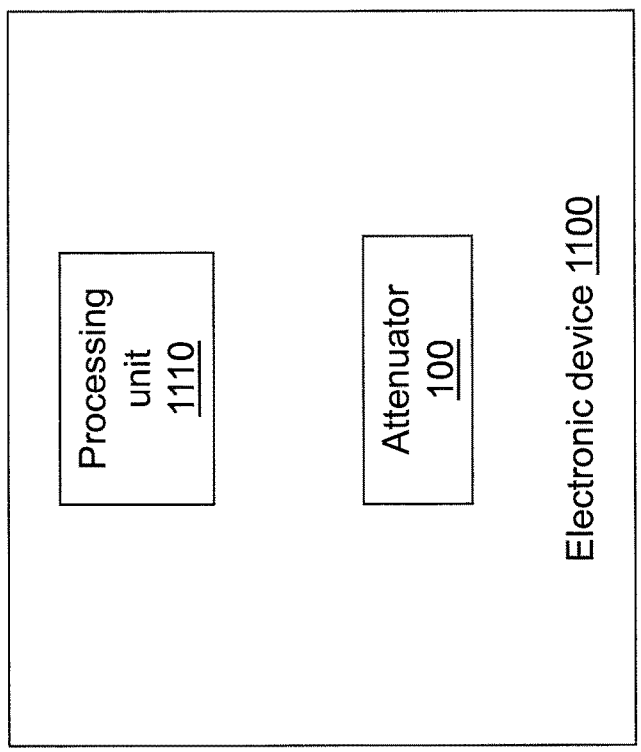
FIG. 11 is a block diagram illustrating an electronic device in which embodiments herein may be implemented.

The attenuator 100 according to the embodiments herein may be employed in various electronic devices. FIG. 11 shows a block diagram for an electronic device 1100, which may be, e.g. a radio frequency transceiver, a radio frequency frontend, a wireless communication device, such as a user equipment or a mobile device and/or a base station, a multi-antenna systems in a radio base station, or any general electronic circuit or equipment, such as an automatic gain control circuit, a measurement equipment etc. The electronic device 1100 may comprise other units, where a processing unit 1110 is shown, which may interactive with the control circuit 110 in the attenuator 100 for different attenuation settings or operating modes.

Those skilled in the art will understand that although switch transistors in the switched resistor array Rs, Rp, the by-pass path 40b and the compensation path 104/106 of the attenuator 100 as shown in FIGS. 4-6 are Field-Effect Transistors (FET), any other types of transistors, e.g. Metal-Oxide-Semiconductor FET (MOSFET), Junction FET (JFET), Bipolar Junction Transistors (BJT) etc., may be comprised in the attenuator 100. When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. An attenuator for attenuating a signal comprising:
a differential input port with a positive input node and a negative input node to receive the signal;
a differential output port with a positive output node and a negative output node to output the attenuated signal;
a first switched resistor network connected between the positive input node and the positive output node;
a second switched resistor network connected between the negative input node and the negative output node;
a pair of compensation paths for cancellation of parasitic leakages in the first and second switched resistor networks, wherein a first compensation path is connected between the positive input node and the negative output node, and a second compensation path is connected between the negative input node and the positive output node; and
a control circuit to generate control signals for controlling the first and second switched resistor networks.

2. The attenuator according to claim 1, wherein the attenuator further comprises a first pair of inductors connected at the differential input port and a second pair of inductors connected at the differential output port.

3. The attenuator according to claim 2, wherein the first and second pair of inductors are mutually coupled inductors.

4. The attenuator according to claim 1, wherein the control circuit is further configured to generate control signals for controlling the pair of compensation paths.

5. The attenuator according to claim 1, wherein each of the first and second switched resistor networks is a Pi type resistor network comprising two switchably variable parallel resistors and one switchably variable series resistor.

6. The attenuator according to claim 5, wherein the switchably variable series resistor comprises one or more switched resistor branches and a by-pass path.

7. The attenuator according to claim 6, wherein the by-pass path comprises a switch, and wherein a bootstrap path comprising a capacitor in series with a resistor is connected between a gate and a drain or source of the switch.

8. The attenuator according to claim 6, wherein each of the one or more switched resistor branches comprises a resistor in series with a switch, and wherein for one or more switches, a bootstrap path comprising a capacitor in series with a resistor is connected between a gate and a drain or source of the switches depending on size of the one or more switches.

9. The attenuator according to claim 5, wherein the switchably variable parallel resistor comprises one or more switched resistor branches connected in series with a resistor.

10. The attenuator according to claim 1, wherein each of the first and second switched resistor networks is a T type resistor network comprising one switchably variable parallel resistor and two switchably variable series resistors.

11. The attenuator according to claim 1, wherein each of the pair of compensation paths comprises one or more switched capacitor branches, and each switched capacitor branch comprises a capacitor connected in series with a resistor.

12. The attenuator according to claim 11, wherein each of the switched capacitor branch further comprises a switch connected in series with the capacitor and the resistor.

13. An electronic device comprising an attenuator according to claim 1.

14. The electronic device according to claim 13, wherein the electronic device is a transceiver.

15. The electronic device according to claim 13, wherein the electronic device is a radio base station.

* * * * *

UNITED STATES PATENT AND TRADEMARK OFFICE
CERTIFICATE OF CORRECTION

PATENT NO. : 10,305,450 B2
APPLICATION NO. : 15/532694
DATED : May 28, 2019
INVENTOR(S) : Mu et al.

Page 1 of 1

It is certified that error appears in the above-identified patent and that said Letters Patent is hereby corrected as shown below:

In the Specification

Column 3, Line 15, delete "node lnp" and insert -- node Inp --, therefor.

Column 3, Line 24, delete "node lnp" and insert -- node Inp --, therefor.

Column 3, Line 37, delete "second switched resistor networks 102/202" and insert -- second switched resistor networks 102/104 --, therefor.

Column 3, Lines 39-40, delete "second switched resistor networks 102/202" and insert -- second switched resistor networks 102/104 --, therefor.

Column 8, Line 54, delete "compensation path 104/106" and insert -- compensation path 106/108 --, therefor.

Signed and Sealed this
Twenty-second Day of October, 2019

Andrei Iancu
*Director of the United States Patent and Trademark Office*